United States Patent
Bessho et al.

(10) Patent No.: US 6,372,548 B2
(45) Date of Patent: Apr. 16, 2002

(54) METHOD FOR FABRICATING A SEMICONDUCTOR PACKAGE WITH A SEMICONDUCTOR DEVICE ATTACHED TO A MULTILAYERED SUBSTRATE

(75) Inventors: Yoshihiro Bessho, Higashi Osaka; Minehiro Itagaki, Moriguchi, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/326,398

(22) Filed: Jun. 4, 1999

(30) Foreign Application Priority Data

Jun. 4, 1998 (JP) .......................................... 10-155553

(51) Int. Cl.$^7$ ........................ H01L 21/603; H01L 21/56
(52) U.S. Cl. ...................................................... 438/118
(58) Field of Search ................................. 438/118, 119; 257/782, 783

(56) References Cited

U.S. PATENT DOCUMENTS

| 5,121,190 A | 6/1992 | Hsiao et al. |
| 5,187,020 A | 2/1993 | Kwon et al. |
| 5,834,339 A | * 11/1998 | Distefano et al. ........... 438/125 |

FOREIGN PATENT DOCUMENTS

| EP | 56167340 | 12/1981 |
| EP | 60001849 | 1/1985 |
| EP | 0 475 022 A1 | 3/1992 |
| EP | 0657 932 A2 | 6/1995 |
| JP | 5-29390 | 2/1993 |
| JP | 6-61303 | 3/1994 |
| WO | WO 94/24704 | 11/1994 |

OTHER PUBLICATIONS

IBM Technical Disclosure Bulletin vol. 35, No. 3 Aug. 1, 1992, pp. 130–131.
European Search Report for Int'l Appln No. 99110618 dated Sep. 2, 1999.
"Mounting Technology For IC" with partial English Translation, pp. 1–3, 1980.

* cited by examiner

Primary Examiner—Howard Weiss
Assistant Examiner—Marcos D. Pizarro-Crespo
(74) Attorney, Agent, or Firm—Ratner & Prestia

(57) ABSTRACT

A semiconductor device has (a) a semiconductor component; (b) a circuit substrate; (c) a base material which is placed between the semiconductor component and the circuit substrate; and (d) a conductive paste, which is filled into a hole formed in the base material, for electrically connecting between a terminal electrode of the semiconductor component and an internal connection electrode of the circuit substrate.

16 Claims, 5 Drawing Sheets

PRIOR ART

PRIOR ART

METHOD FOR FABRICATING A SEMICONDUCTOR PACKAGE WITH A SEMICONDUCTOR DEVICE ATTACHED TO A MULTILAYERED SUBSTRATE

BACKGROUND OF THE INVENTION

1. Field of the Invention

The present invention relates to a semiconductor device which is packaged for the mounting of a semiconductor component onto a circuit substrate, and to a method of manufacturing the same.

2. Description of the Related Art

There have been developed many types of packaging technologies including, as a typical one, quad flat pack (QFP). These packaging techniques are used to provide, at the time of mounting a semiconductor component onto a circuit substrate, facilitation of the protection and the mounting of semiconductor components. Because of the increase in connection terminal count in semiconductor components, the package size of semiconductor components is on the increase. Accordingly, it is becoming difficult for such conventional packaging technologies to deal effectively with demands for the reduction of mounting area.

With a view to meeting the demands, there has been devised a technique in which a bare semiconductor component is directly mounted onto a circuit substrate for the reduction and effective use of mounting area. For example, when a semiconductor component is connected to a circuit substrate, a layer of vapor-deposited adhesive metal or a layer of vapor-deposited diffusion protection metal is preformed on a terminal electrode of the semiconductor component and a projecting electrode of solder formed by plating is constructed overlying the layer. Subsequently, the semiconductor component is faced down and heated up to a high temperature. As a result of such application of heat, the solder is fused to a connection electrode of the circuit substrate. Such a mounting method is considered an effective technique because it can provide high post-connection mechanical strength and establish connection in a single process ("IC MOUNTING TECHNOLOGY", edited by Japan Microelectronics Association, published on Jan. 15, 1980, Institute for Industrial Research).

In addition to the above-described method, there have been proposed other methods. For instance, U.S. Pat. No. 5,121,190 and Japanese Patent Application (unexamined) Pub. No. 6-61303 show mounting techniques and semiconductor devices in which a molding compound is used to secure the stability of solder joints. One such conventional semiconductor device will be described below by reference to FIGS. 7 and 8. FIG. 7 shows a layout of terminal electrodes of a commonly-used semiconductor component. FIG. 8 shows in cross section major parts of a conventional semiconductor device with a semiconductor component mounted face down.

In the terminal electrode layout of FIG. 7, terminal electrodes 16 are laid out around the periphery of a semiconductor component 15. In order to deal with an increase in the number of terminal electrodes 16, it is required to either reduce the gap between terminal electrodes 16 or increase the size of the semiconductor component 15 for coping with such an electrode number increase.

The semiconductor device of FIG. 8, in which the semiconductor component 15 is mounted face down, comprises, in addition to the semiconductor component 15, a terminal electrode 16 of the semiconductor component 15, a circuit substrate 17, a connection electrode 18 formed on a surface of the circuit substrate 17, a solder joint 19 which joints together the connection electrode 18 and the terminal electrode 16, a molding (sealing) resin 20 which seals the semiconductor component 15, and other structural elements.

A method of manufacturing a conventional semiconductor device having the above-described structure will be described below. In the first place, a projecting electrode of solder is preformed on the terminal electrode 16 of the semiconductor component 15. Thereafter, the semiconductor component 15 is mounted, in face down fashion, onto the circuit substrate 17. This is followed by alignment of the solder projecting electrode with a given position of the connection electrode 18. Next, the solder is melted by application of high-temperature heat (from 200 to 300 degrees centigrade), and the solder projecting electrode and the connection electrode 18 are joined together. In this way, the semiconductor component 15 is fixed to the circuit substrate 17 by the solder joint 19. Thereafter, a gap, created between the semiconductor component 15 and the circuit substrate 17, is filled with the molding resin 20 in the form of liquid. By heat hardening at about 120 degrees centigrade, the molding resin 20 is solidified. In this way, the mounting of the semiconductor component 15 onto the circuit substrate 17 is completed to provide a semiconductor device as shown in FIG. 8.

However, the above-described conventional semiconductor devices and associated manufacture methods have the following drawbacks.

Firstly, in order to protect the surface of the semiconductor component 15, it is required to fill a gap between the semiconductor component 15 and the circuit substrate 17 with the molding resin 20, and the mounting size increases accordingly. Therefore, when used as a packaged semiconductor device, its size becomes greater than that of the semiconductor component 15.

Secondly, if the number of terminal electrodes 16 of the semiconductor component 15 increases as the circuit scale increases, then the gap between adjacent terminal electrodes 16 is made narrower, resulting in reducing the size and the pitch of the solder joint 19 and consequently the reliability of the solder joint 19 between the semiconductor component 15 and the circuit substrate 17 will drop.

Thirdly, in order to facilitate the mounting of the terminal electrodes 16 laid out around the periphery of the semiconductor component 15 in face-down manner, it is required to use a multi-level wiring technique making use of a thin film technology for two-dimensionally placing the terminal electrodes 16 on the semiconductor component 15, to increase the size and the pitch of the terminal electrodes 16. However, such arrangement produces some problems, that is, semiconductor device yield is decreased and manufacturing costs are increased.

In view of the above, there is the limit of down-sizing semiconductor devices, improving their reliability to a further extent, and reducing their production costs and therefore the foregoing prior art techniques are not very practical. Particularly, in order to deal with the increase in the number of terminals in a semiconductor component, the above-described problems become increasingly serious.

SUMMARY OF THE INVENTION

The present invention was made with a view to providing solutions to the foregoing problems with the prior art techniques. Accordingly, an object of the present invention is to provide a down-sized, thinned, highly-reliable semiconductor device capable of dealing with higher terminal count, and a method of manufacturing the same.

One aspect of the present invention is a semiconductor device comprising:

(a) a semiconductor component;

(b) a circuit substrate;

(c) a base material which is placed between said semiconductor component and said circuit substrate; and (d) a conductive paste, which is filled into a hole formed in said base material, for electrically connecting between a terminal electrode of said semiconductor component and an internal connection electrode of said circuit substrate.

Another aspect of the present invention is a semiconductor device comprising:

(a) a semiconductor component;

(b) a circuit substrate; and (c) a conductive paste, which is filled into a hole formed in a surface of said circuit substrate at the side of said semiconductor component, for electrically connecting between a terminal electrode of said semiconductor component and an external connection electrode of said circuit substrate.

Still another aspect of the present invention is a method of manufacturing a semiconductor device in which a semiconductor component is mounted onto a circuit substrate, said semiconductor device manufacture method comprising:

(a) a hole forming step of forming a hole in a base material;

(b) a paste filling step of filling a conductive paste into said hole; and (c) a connecting step of mechanically connecting said semiconductor component to said circuit substrate through said base material while at the same time electrically connecting between a terminal electrode of said semiconductor component and a connection electrode of said circuit substrate by said conductive paste.

Such arrangement eliminates the need for filling a gap between the semiconductor component and the circuit board (or the base material) with a molding resin, whereby the mounting size of semiconductor components can be reduced down to the size of semiconductor components.

Additionally, by the use of a multi-layered substrate for converting a layout of terminal electrodes placed around the periphery of a semiconductor component into a two-dimensional layout, it becomes possible to provide a semiconductor device capable of easily dealing with an increase in the number of terminal electrodes in a semiconductor component.

REFERENCE NUMERALS IN DRAWINGS

Figure 1A:
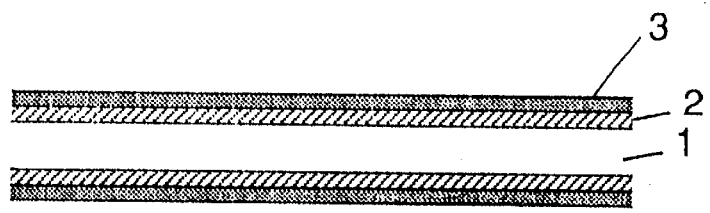
FIG. 1 illustrates in cross section successive steps of a method of manufacturing a semiconductor device according to a first embodiment of the present invention.

1 ORGANIC FILM
2 ADHESIVE LAYER
3 RELEASABLE FILM
4 PENETRATION HOLE
5 CONDUCTIVE PASTE
6 SEMICONDUCTOR COMPONENT
7 TERMINAL ELECTRODE
8 MULTI-LAYERED SUBSTRATE
9 CONNECTION ELECTRODE
10 COMPRESSED CONDUCTIVE PASTE
11 EXTERNAL CONNECTION TERMINAL
12 POROUS BASE MATERIAL
13 PROJECTING ELECTRODE
14 MULTI-LAYERED SUBSTRATE WITH A SURFACE LAYER OF DUCTIVE PASTE
15 SEMICONDUCTOR COMPONENT
16 TERMINAL ELECTRODE
17 CIRCUIT SUBSTRATE
18 CONNECTION ELECTRODE
19 SOLDER JOINT
20 MOLDING RESIN

DESCRIPTION OF THE PREFERRED EMBODIMENTS

Embodiments of the present invention will be described below by making reference to the attached drawings.

(First Embodiment)

Referring to the drawings, a first embodiment of the present invention is now described below.

Figure 2:
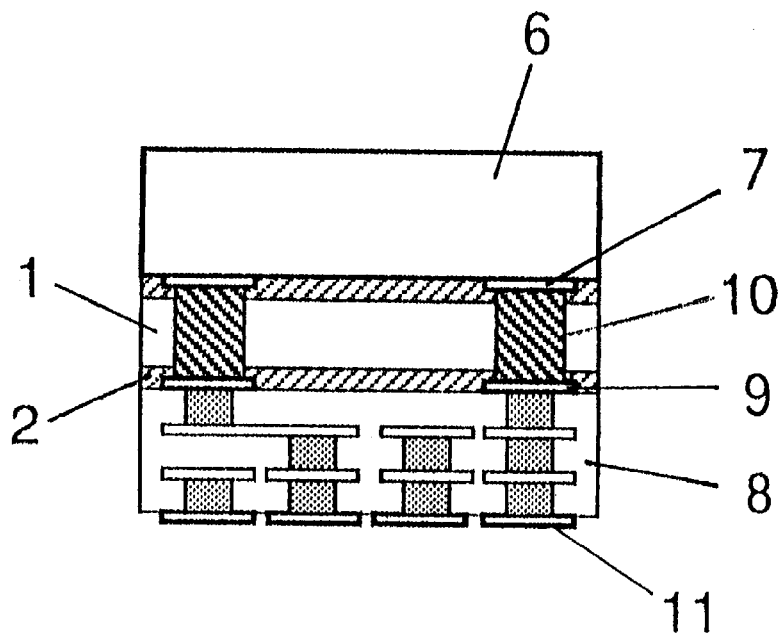
FIG. 2 illustrates in cross section a structure of the semiconductor device of the first embodiment.
Figure 3:
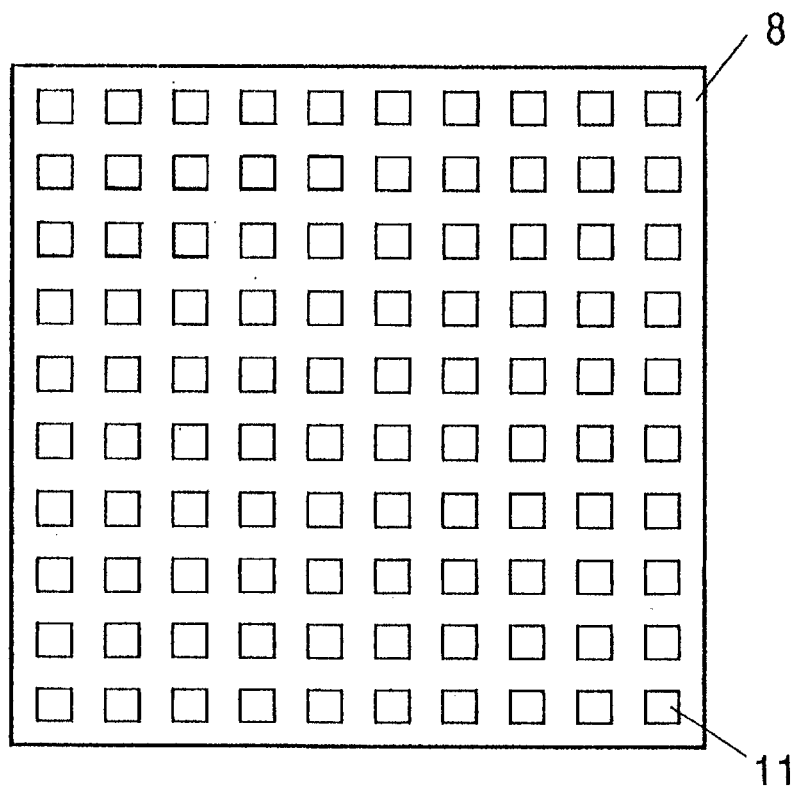
FIG. 3 is an illustration of a layout of external connection terminals of the semiconductor device of the first embodiment.

FIG. 1 illustrates in cross section successive steps of a method of manufacturing a semiconductor device in the first embodiment of the present invention. FIG. 2 is a cross sectional view of a structure of the semiconductor device of the first embodiment. FIG. 3 is an illustration of a layout of external connection terminals of the semiconductor device of the first embodiment. It is to be noted that the dimensions of structural elements depicted in these figures are exaggerated for the sake of convenience of the description of the present invention.

As shown in FIGS. 2 and 3, the semiconductor device of the present embodiment comprises the following: a semiconductor component 6, a terminal electrode 7 formed on the semiconductor component 6, a multi-layered substrate 8, an external connection terminal 11 which is two-dimensionally laid out on one of the surfaces of the multi-layered substrate 8 opposite to the other surface thereof to which the semiconductor component 6 is connected, an organic film 1 which has, on each of its surfaces, an adhesive layer 2 for mechanically connecting between the semiconductor component 6 and the multi-layered substrate 8, a conductive paste 5 for electrically connecting between the semiconductor component 6 and the multi-layered substrate 8, and other components. In FIGS. 1(a) to 1(e), reference numeral 3 represents a releasable film. Reference numeral 4 represents a penetration hole. Reference numeral 9 represents a connection terminal. Reference numeral 10 represents the conductive paste compressed. FIG. 3 shows that the number of external connection terminals 11 formed on the multi-layered substrate's 8 surface is 10 by 10 (=100). However, in FIGS. 1 and 2, only sixteen (4 by 4) external connection terminals 11 are shown in cross section for the sake of convenience.

Meanwhile the whole can be non-passed type.

Next, a method of manufacturing a semiconductor device in accordance with the present embodiment will be described below.

In the first place, the adhesive layer 2 (for example, an epoxy resin layer) is formed on both surfaces of the organic film 1 which is a non-compressible base material (e.g., an aramide film), and a base material is prepared carrying on both surfaces thereof the releasable film 3 (FIG. 1(a)).

Figure 1B:
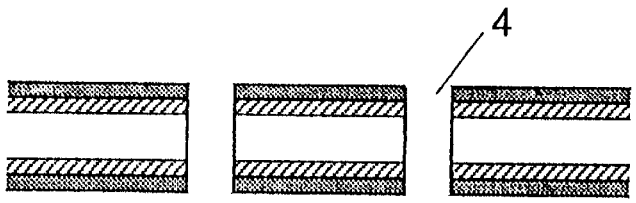

Next, the penetration hole 4 is formed at a given position of the organic film 1 by laser-beam machining or the like technique (FIG. 1(b)). This step corresponds to the step of forming a penetration hole in the present invention.

Figure 1C:
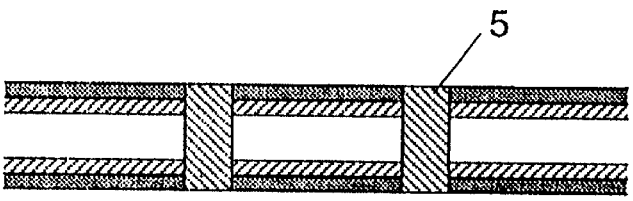
Figure 1D:
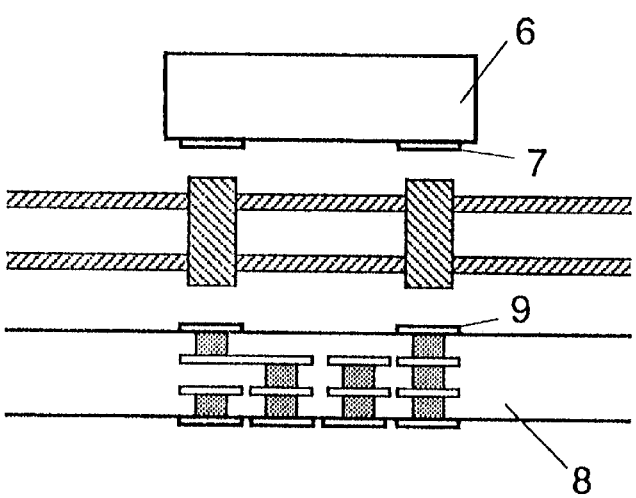
Figure 1E:
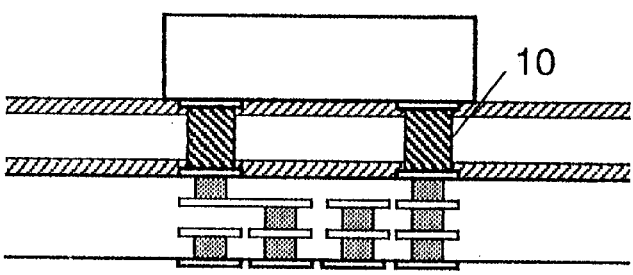

Subsequently, the penetration hole 4 is filled with the conductive paste 5 (FIG. 1(c)). The step of filling the penetration hole 4 with the conductive paste 5 is carried out as follows. The organic film 1 with the penetration hole 4 is placed on the table of a printer and the conductive paste 5 is printed directly from over the releasable film 3. At this time, the overlying releasable film 3 acts as a printing mask while protecting the surface of the adhesive layer 2 from being contaminated. This step corresponds to the step of filling a paste in the present invention.

Thereafter, the releasable films 3 are peeled off from the surfaces of the adhesive layer 2. One of the surfaces of the adhesive layer 2 is aligned with the terminal electrode 7 of the semiconductor component 6 and the other of the surfaces of the adhesive layer 2 is aligned with the connection electrode 9 of the multi-layered substrate 8 for lamination (FIG. 1(d)) This is followed by application of heat/pressure, so that the semiconductor component 6 and the multi-layered substrate 8 are mechanically connected together by the adhesive layer 2 (FIG. 1(e)). Further, in this step, the conductive paste 5 is compressed, as a result of which a conductive substance of the conductive paste 5 is densified at the same time that the conductive substance hardens. The terminal electrode 7 of the semiconductor component 6 and the connection electrode 9 of the multi-layered substrate 8 are electrically connected together by the compressed conductive paste 10. A combination of the step of FIG. 1(d) and the step of FIG. 1(e) corresponds to the connecting step of the present invention.

The base material of film 1 may include self-adhesive properties. In connecting semiconductor component 6 to substrate 8 utilization may be made of the self-adhesiveness of the base material of film 1.

(Second Embodiment)

A second embodiment of the present invention will be described by reference to the drawings. The present embodiment relates to a semiconductor device that is identical with the one disclosed in the first embodiment, with the exception that the present embodiment employs a base material layer which is composed mainly of a compressible base material. Accordingly, the same reference numerals have been used to indicate basically like elements in the present embodiment and the first embodiment and their description is omitted. Especially, as to the elements that are not described here, they are to be regarded as the same ones as described in the first embodiment.

Figure 4:
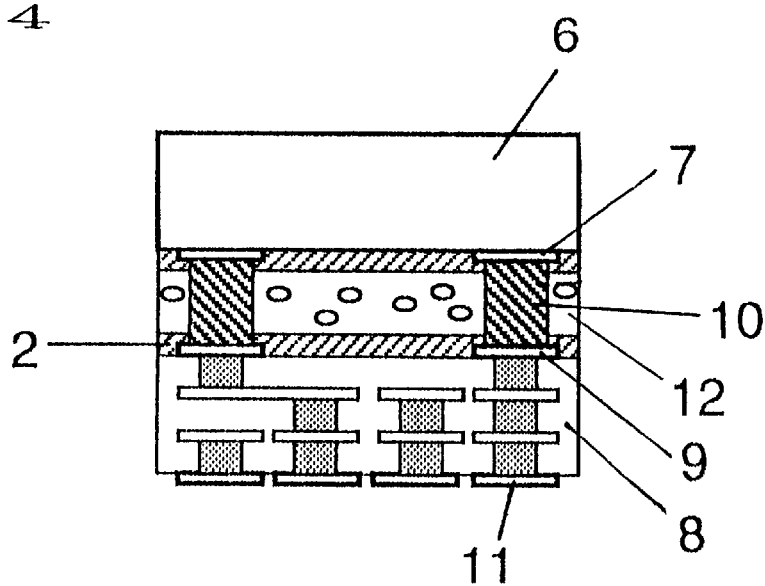
FIG. 4 illustrates in cross section a structure of a semiconductor device according to a second embodiment of the present invention.

FIG. 4 depicts in cross section a structure of the semiconductor device in accordance with the second embodiment. When compared with the first embodiment, the present embodiment has substantially the same structure as the first embodiment, with the exception that in the second embodiment, a porous base material 12 is used in place of the organic film 1.

The semiconductor device of the present embodiment is manufactured using substantially the same fabrication steps as in the first embodiment.

The porous base material 12 (e.g., a composite material prepared by impregnating aromatic polyamide fiber with a thermosetting epoxy resin) is used as a base material for establishing mechanical and electrical connection between the semiconductor component 6 and the multi-layered substrate 8. The use of the porous base material 12 provides, in addition to the effects of the first embodiment, the advantage that since the porous base material 12 is easily compressed during application of heat and pressure in the connecting step of the present invention, the conductive substance of the conductive paste 5 is densified to a further extent.

(Third Embodiment)

A third embodiment of the present invention will be explained by reference to the drawings. The present embodiment relates to a semiconductor device which is identical with the one disclosed in the first embodiment, with the exception that in the present embodiment, the semiconductor component of the semiconductor device includes a projecting electrode. Accordingly, the same reference numerals have been used to indicate basically like elements in the present embodiment and the first embodiment and their description is omitted. Especially, as to the elements that are not described here, they are to be considered as the same ones as described in the first embodiment.

Figure 5:
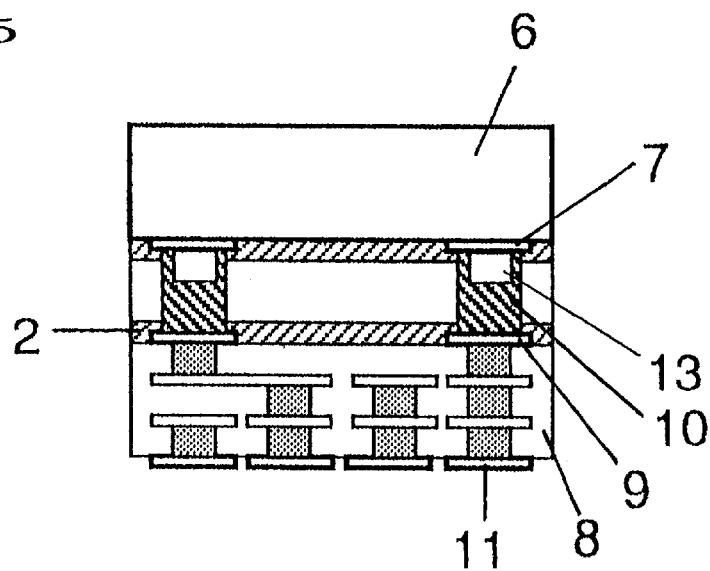
FIG. 5 illustrates in cross section a structure of a semiconductor device according to a third embodiment of the present invention.

Referring to FIG. 5, there is shown in cross section a structure of the semiconductor device according to the third embodiment. When compared with the first embodiment, the present embodiment has substantially the same structure as the first embodiment, with the exception that in the present embodiment, a projecting electrode 13 is formed, overlying the terminal electrode 7 of the semiconductor component 6.

A method of manufacturing a semiconductor device of the present embodiment will be described. This method employs substantially the same steps as in the first embodiment, with the exception that the present embodiment includes, prior to the connecting step of the semiconductor manufacture method of the first embodiment, a step of forming the projecting electrode 13 on the terminal electrode 7 of the semiconductor component 6, and that in the connecting step of the present embodiment, the terminal electrode 7 and the connection electrode 9 are electrically connected together by a conductive paste through the projecting electrode 13.

The formation of the projecting electrode 13 on the terminal electrode 7 of the semiconductor component 6 provides, in addition to the effects of the first embodiment, the advantage that since the conductive paste 5 is compressed by an amount corresponding to the projecting electrode 13 during application of heat and pressure in a step of the manufacture of the semiconductor device, the conductive substance of the conductive paste 5 is densified to a further extent.

If a semiconductor component of the semiconductor device of the second embodiment has a structure including a projecting electrode of the present invention, this provides, in addition to the effects of the second embodiment, the advantages that the conductive substance of the conductive paste 5 is densified to a further extent, as in the above.
(Fourth Embodiment)

A fourth embodiment of the present invention will be described by reference to the drawings. The present embodiment relates to a semiconductor device which is identical with the one disclosed in the first embodiment, with the exception that in the semiconductor device of the present embodiment, the circuit substrate has an adhesive layer and a conductive paste of the present invention and that no base material of the present invention is used. Accordingly, the same reference numerals have been used to indicate basically like elements in the present embodiment and the first embodiment and their description is omitted. Especially, as to the elements that are not described here, they are to be regarded as the same ones as described in the first embodiment.

Figure 6:
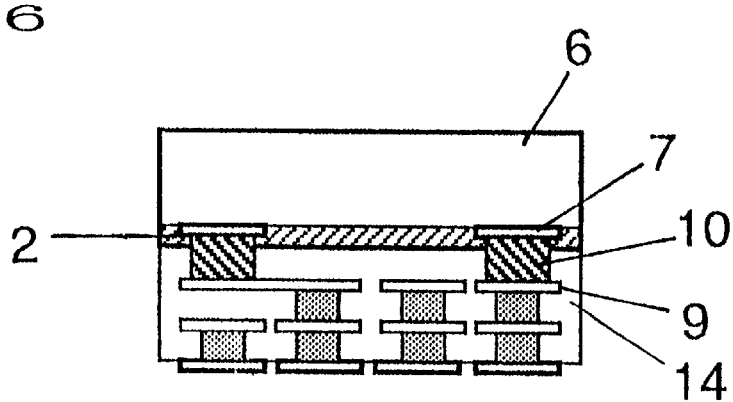
FIG. 6 illustrates in cross section a structure of a semiconductor device according to a fourth embodiment of the present invention.
Figure 7:
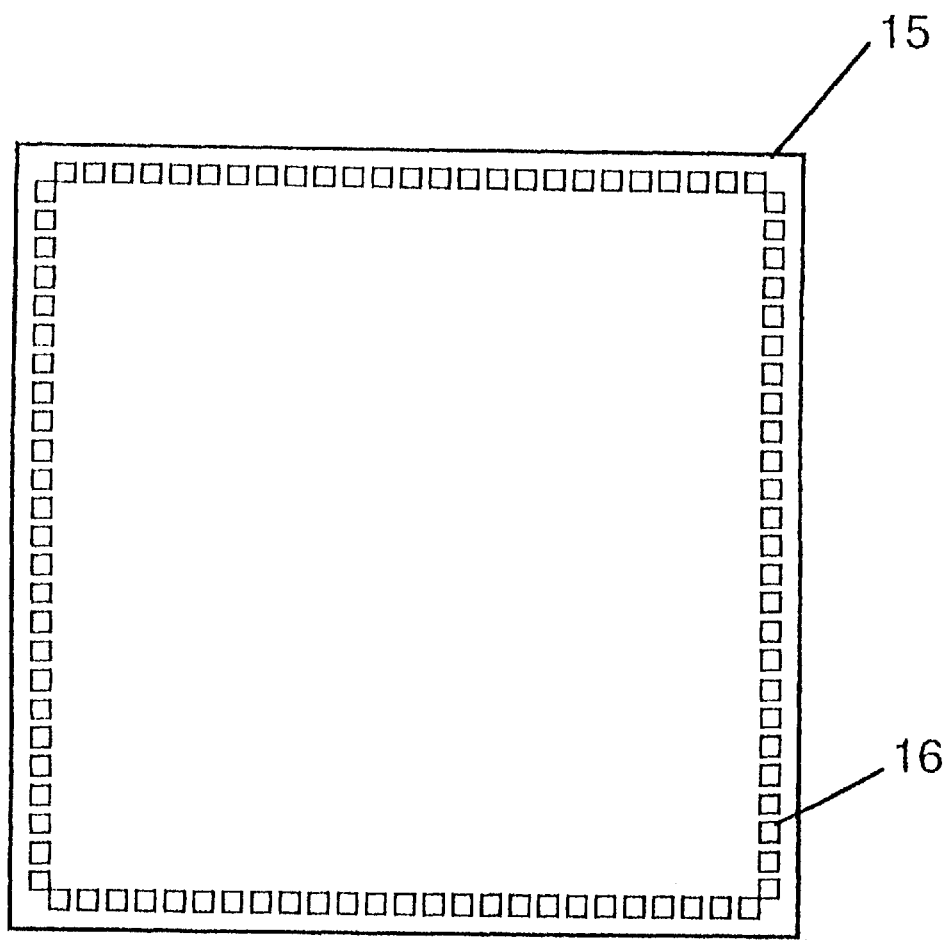
FIG. 7 is an illustration of a layout of terminal electrodes of a commonly-used semiconductor component.
Figure 8:
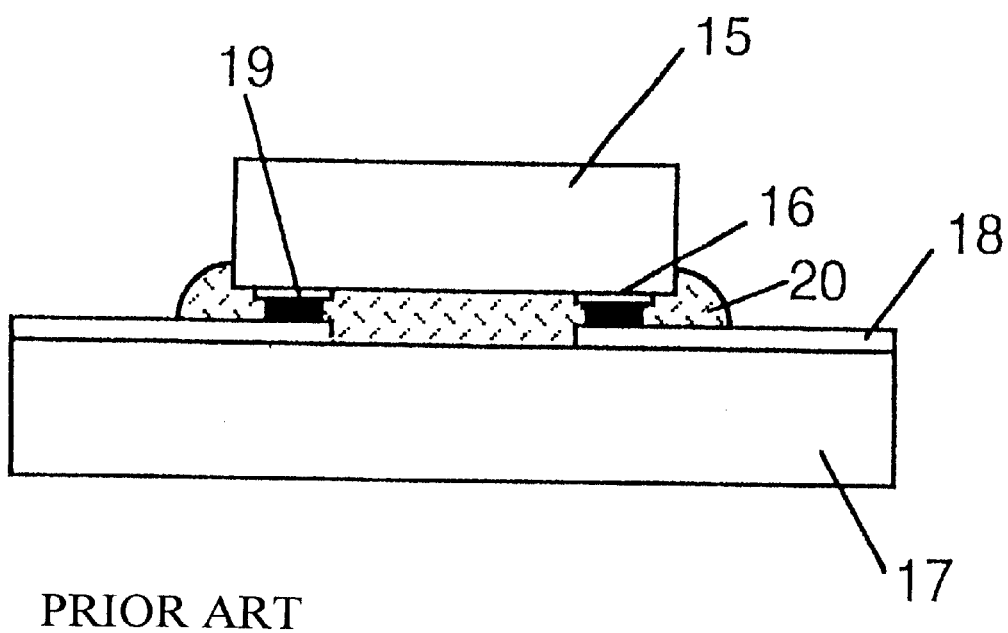
FIG. 8 illustrates in cross section major parts of a conventional semiconductor device in which a semiconductor component is mounted in face down manner.

Referring to FIG. 6, there is shown in cross section a structure of the semiconductor device according to the fourth embodiment. When compared with the first embodiment, the present embodiment has substantially the same structure as the first embodiment, with the exception that in the present embodiment, a multi-layered substrate 14 is employed. Formed on a surface layer of the multi-layered substrate 14 that is connected to the semiconductor component 6 is the conductive paste 10 and the adhesive layer 2.

The use of the multi-layered substrate 14 (which carries, on its surface layer that is connected to the semiconductor component 6, the conductive paste 10 and the adhesive layer 2) provides, in addition to the effects of the first embodiment, the advantage that base materials, such as the organic film 1 and the porous base material 12, are no longer needed therefore making it possible to provide a much thinner semiconductor device.

Meanwhile the hole can be passed through type.

In each of the above-described embodiments of the present invention, resins (e.g., epoxy resin, silicone resin, and phenol resin) containing fine powders of Ag, Au, Cu, Ni, or the like can be used as materials for the conductive paste 10 as long as these resins have satisfactory conductivity and are thermosettable.

Even if the circuit substrate of the semiconductor device in the second or third embodiment is constructed to include an adhesive layer and a conductive paste of the present invention and to have no base material of the present invention, such arrangement provides, in addition to the effects of the second or third embodiment, the same advantage as described above.

It has been described in the first to fourth embodiments that the circuit substrate of the present invention is implemented by a multi-layered substrate that has, on one of the surfaces thereof facing the semiconductor component as well as on the opposite surface, external connection terminals arranged two-dimensionally in a matrix. This is not considered to be restrictive. For instance, these external connection terminals can be arranged two-dimensionally at random.

Additionally, it has been described that the conductive substance of the conductive paste used in the present invention is densified by compression. This is not considered to be restrictive. Even if such compaction by compression is omitted, it is possible to provide an effect of manufacturing a down-sized, thinned semiconductor device.

As can be seen from the above-description, the present invention is able to provide a down-sized, thinned, highly-reliable semiconductor device capable of dealing with the increase in terminal count, and a method of manufacturing the same.

In other words, by the use of a multi-layered substrate capable of a two-dimensional conversion of the layout of the terminal electrodes placed around the periphery of a semiconductor component in the present invention, it becomes possible to provide a semiconductor device that is able to easily deal with an increase in the number of terminal electrodes in a semiconductor component.

In accordance with the semiconductor device manufacture method of the present invention, there is no need to fill a gap, created between the semiconductor component and the circuit substrate (or the base material) with a molding resin, and it becomes possible to reduce the mounting size of semiconductor component to the size of semiconductor component.

What is claimed is:

1. A method of manufacturing a semiconductor device in which a semiconductor component is mounted onto a circuit substrate, said semiconductor device manufacture method comprising the steps of:
   (a) forming a hole in a base material;
   (b) filling a conductive paste into said hole;
   (c) pressing said semiconductor component onto said circuit substrate through said base material for compressing the base material while at the same time electrically connecting a terminal electrode of said semiconductor component and a connection electrode of said circuit substrate by said conductive paste; and
   (d) cutting said base material and said circuit substrate into the same size after pressing said semiconductor component to said circuit substrate.

2. The semiconductor device manufacture method according to claim 1, wherein
   said hole and a surface of said base material at a side of said circuit substrate are connected together by an IVH (inner via hole) structure.

3. The semiconductor device manufacture method according to claim 2, wherein
   at least the surface of said base material at a side of said semiconductor component is self-adhesive, and
   in said hole forming step, said hole is formed in at least said base material surface at the side of said semiconductor component.

4. The semiconductor device manufacture method according to claim 3, wherein
   in said pressing step is established by making utilization of the self-adhesiveness of said base material.

5. The semiconductor device manufacture method according to claim 2, wherein
   said base material has, on at least the surface of said base material at a side of said semiconductor component, an adhesive layer, and
   in said hole forming step, said hole is formed such that said hole passes through at least said adhesive layer.

6. The semiconductor device manufacture method according to claim 5, wherein
   said pressing step is established by making utilization of said adhesive layer of said base material.

7. The semiconductor device manufacture method according to claim 1, wherein
   said base material has, on at least a surface of said base material at a side of said semiconductor component, an adhesive layer, and
   in said hole forming step, said hole is formed such that said hole passes through at least said adhesive layer.

8. The semiconductor device manufacture method according to claim 7, wherein said pressing step is established by making utilization of said adhesive layer of said base material.

9. The semiconductor device manufacture method according to claim 1, wherein at least a surface of said base material at a side of said semiconductor component is self-adhesive, and in said hole forming step, said hole is formed in at least said base material surface at the side of said semiconductor component.

10. The semiconductor device manufacture method according to claim 9, wherein said pressing step is established by making utilization of the self-adhesiveness of said base material.

11. The semiconductor device manufacture method according to claim 1, wherein said semiconductor component has a projecting electrode on said terminal electrode, and in said connecting step, said terminal electrode is electrically connected to said connection electrode through said projecting electrode and said conductive paste.

12. The semiconductor device manufacture method according to claim 1, wherein in said pressing step, a conductive substance contained in said conductive paste is densified by compression.

13. A method of manufacturing a semiconductor device according to claim 1, wherein in said cutting step (d), said base material and said circuit substrate are cut into the size of said semiconductor component.

14. A method of manufacturing a semiconductor device according to claim 1, wherein said base material is an organic film.

15. A method of mounting a terminal electrode of a semiconductor component onto a circuit substrate, the semiconductor component having a plurality of terminal electrodes arranged along a peripheral boundary of the semiconductor component, comprising the steps of:

(a) forming an adhesive layer on each of opposite surfaces of a base material;

(b) forming a releasable film on each adhesive layer formed in step (a);

(c) forming a hole in the base material;

(d) filling the hole with a conductive paste;

(e) peeling away the releasable film on each of the adhesive layers after filling the hole in step (d);

(f) forming the circuit substrate including the following steps:

(f1) providing a first plurality of external terminals on one surface of the circuit substrate, the first plurality of external terminals arranged to mate with the plurality of terminal electrodes of the semiconductor component;

(f2) providing a second plurality of external terminals on another surface of the circuit substrate, the second plurality of external terminals arranged in a matrix array format; and (f3) connecting electrically, inside the circuit substrate, the first plurality of external terminals to the second plurality of external terminals;

(g) sandwiching the base material between the semiconductor component and the circuit substrate and pressing the semiconductor component onto the circuit substrate to compress the base material and the conductive paste; and (h) mating a terminal electrode of the semiconductor component with one external terminal of the first plurality of external terminals, whereby the terminal electrode of the semiconductor component is electrically connected to an external terminal of the second plurality of external terminals.

16. A method of manufacturing a semiconductor device having a plurality of terminal electrodes in which a semiconductor component is mounted onto a circuit substrate having a plurality of connection electrodes, said semiconductor device manufacture method comprising the steps of:

(a) forming an adhesive layer on each of opposite surfaces of a base material;

(b) forming a releasable film on each adhesive layer formed in step (a);

(c) forming a hole in the base material;

(d) filling a conductive paste into the hole;

(e) peeling away the releasable film on each of the adhesive layers after filling the hole in step (d); and (f) pressing the semiconductor component onto the circuit substrate, for compressing the base material and the conductive paste, and electrically connecting a terminal electrode of said semiconductor component, a connection electrode of said circuit substrate, and the conductive paste.

* * * * *